US006751452B1

(12) United States Patent
Kupczyk et al.

(10) Patent No.: US 6,751,452 B1
(45) Date of Patent: Jun. 15, 2004

(54) INTERNET BASED VEHICLE DATA COMMUNICATION SYSTEM

(75) Inventors: Marek Kupczyk, Birmingham, MI (US); Ron J. Grajewski, Sherby Township, MI (US)

(73) Assignee: General Motors Coporation, Detroit, MI (US)

( * ) Notice: Subject to any disclaimer, the term of this patent is extended or adjusted under 35 U.S.C. 154(b) by 0 days.

(21) Appl. No.: 09/563,259

(22) Filed: May 1, 2000

(51) Int. Cl.[7] .......................... G08G 1/123; H04B 7/00; H05K 11/02

(52) U.S. Cl. ......................... 455/345; 455/99; 455/456; 455/66.1; 455/12.1; 340/989; 370/400; 701/29; 701/33

(58) Field of Search ................................ 455/412, 66.1, 455/517, 345, 99, 456, 12.1, 11.1, 427, 3.02, 3.05, 344; 370/400, 349, 352, 310; 379/265, 207, 210, 211, 221, 225; 340/988, 426, 955, 425.5, 438–462, 439.9, 439.22, 439.24; 701/29, 33, 2, 13, 207

(56) References Cited

U.S. PATENT DOCUMENTS

| | | | | | |
|---|---|---|---|---|---|
| 4,750,197 | A | * | 6/1988 | Denekamp et al. | 455/404.2 |
| 4,804,937 | A | | 2/1989 | Barbiaux et al. | 340/52 |
| 5,396,540 | A | * | 3/1995 | Gooch | 342/357.09 |
| 5,400,018 | A | * | 3/1995 | Scholl et al. | 701/33 |
| 5,442,553 | A | | 8/1995 | Parrillo | 364/424.04 |
| 5,465,207 | A | * | 11/1995 | Boatwright et al. | 701/52 |
| 5,493,694 | A | * | 2/1996 | Vlcek et al. | 455/456 |
| 5,548,516 | A | | 8/1996 | Gudat et al. | 364/443 |
| 5,553,202 | A | | 9/1996 | Wakabayaski et al. | 395/115 |
| 5,554,993 | A | | 9/1996 | Bricketll | 342/357 |
| 5,621,888 | A | | 4/1997 | Botzenhardt | 395/85.05 |
| 5,640,511 | A | | 6/1997 | Botzenhardt et al. | 395/185.1 |
| 5,732,074 | A | * | 3/1998 | Spaur et al. | 370/313 |
| 5,754,137 | A | * | 5/1998 | Durrstein | 701/50 |
| 5,768,625 | A | * | 6/1998 | Muramatsu et al. | 701/1 |
| 5,777,580 | A | | 7/1998 | Janky et al. | 342/457 |
| 5,815,071 | A | * | 9/1998 | Doyle | 701/29 |
| 5,867,783 | A | | 2/1999 | Horstein et al. | 455/427 |
| 5,918,180 | A | | 6/1999 | Dimino | 455/456 |
| 5,920,821 | A | | 7/1999 | Seazholtz et al. | 455/466 |
| 5,956,324 | A | | 9/1999 | Engdahl et al. | 370/242 |
| 6,006,159 | A | * | 12/1999 | Schmier et al. | 340/988 |
| 6,008,758 | A | * | 12/1999 | Campbell | 342/358 |
| 6,009,363 | A | * | 12/1999 | Beckert et al. | 455/345 |
| 6,021,371 | A | * | 2/2000 | Fultz | 340/988 |

(List continued on next page.)

OTHER PUBLICATIONS

"Who We Are", ORBCOMM Global, L.P. 1999, p. 1–8.

*Primary Examiner*—Sinh Tran
*Assistant Examiner*—Kamran Afshar
(74) *Attorney, Agent, or Firm*—Christopher DeVries

(57) ABSTRACT

An internet based two-way data communication system for interrogating and programming the electronics of motor vehicles, with global positioning system (GPS) and real-time class 2 communication capabilities. A vehicle communications package (VCP) is located aboard each subject motor vehicle which is electronically interfaced with selected electronics of the respective motor vehicle and which provides wireless reception of GPS signals and reception and transmission of Class 2 data with respect to communication satellites, and further includes a website having a predetermined internet URL. Wireless communication between the website and the VCP is provided via a communication satellite provider having an internet interface, or a cellular telephone provider having an internet interface. The website is by a user using any computer, located anywhere and having internet access, simply by entering the website URL and the user's pre-established password/user name permissions. The website provides a user selectable display for organizing data received from and to be sent to the one or more motor vehicles.

7 Claims, 11 Drawing Sheets

U.S. PATENT DOCUMENTS

| | | | | | |
|---|---|---|---|---|---|
| 6,023,232 | A | * | 2/2000 | Eitzenberger | 340/426 |
| 6,105,060 | A | * | 8/2000 | Rothblatt | 709/219 |
| 6,181,994 | B1 | * | 1/2001 | Colson et al. | 701/33 |
| 6,240,365 | B1 | * | 5/2001 | Bunn | 701/213 |
| 6,295,492 | B1 | | 9/2001 | Lang et al. | 701/33 |
| 6,330,499 | B1 | * | 12/2001 | Chou et al. | 701/33 |
| 6,418,146 | B1 | * | 7/2002 | Miloslavsky | 455/517 |
| 2002/0010000 | A1 | * | 1/2001 | Chern et al. | 455/517 |

* cited by examiner

INTERNET BASED VEHICLE DATA COMMUNICATION SYSTEM

TECHNICAL FIELD

The present invention relates to data communications between motor vehicle electronics and a website, capable of real-time Class 2 two-way data communication and including integrated global positioning system information.

BACKGROUND OF THE INVENTION

Motor vehicle electronics data are used to monitor and evaluate operational characteristics of motor vehicle systems. This is an especially important facet of new model testing prior to public introduction. Typically, motor vehicle testing is conducted at a proving ground, but frequently testing is also performed on public highways. The data accumulated from the testing is typically stored in a data recording device or data recording media and manually delivered to a diagnostic station for evaluation. Under this mode of testing, after the data has been analyzed, if adjustments to the electronics of the motor vehicle are needed, a technician must make these adjustments physically at the motor vehicle. In view of the time and labor constraints inherent with the typical motor vehicle testing regimen, it would be very desirable if two-way data could somehow be wirelessly transmitted between the motor vehicle and the diagnostic station.

In the prior art it is known that motor vehicle electronics monitoring and programming can be accomplished using wireless communication, for example as disclosed by U.S. Pat. Nos. 4,804,937 and 5,442,553. However, it remains a problem in the art that wireless communication systems which could be used for motor vehicle two-way wireless communication, such as for example radio and cellular phones, are limited either in terms of range or coverage. Another problem that has yet to be overcome is the need to have an expensive diagnostic station at the monitoring end if successful two-way data communication is to be accomplished in real time.

In overcoming the aforesaid problems, two emerging technologies are of interest: the internet and communication satellites.

The internet is a now ubiquitous communication system for inter-computer data transfer. The world wide web (web) is an aspect of the internet, wherein a website, hosted by an internet service provider (ISP), is accessible to computer users who have access to the web by entering a universal resource locator (URL), most commonly represented by a "domain name", as for example "http://www.PatentApplication.com". Some websites are open to the general public, while other websites or portions of websites are access restricted by "permissions" requiring entry of a user password and/or user name to gain access. Computer users who have access to the web can communicate back and forth substantially instantaneously using electronic data transfer, commonly known as "e-mail".

Low earth orbit (LEO) communication satellites are now also well established; one such system in this regard is known as "ORBCOMM". The ORBCOMM system uses a constellation of LEO communication satellites which provide world-wide wireless coverage. The communication satellites are capable of sending and receiving two-way alphanumeric data packets, similar to two-way paging and e-mail. Three main components of the ORBCOMM system are: a space segment, a ground segment and subscriber communicators. The space segment is composed of a constellation of (presently about 35) LEO communication satellites. The communication satellites are "orbiting packet routers" ideally suited to "grab" small data packets from sensors in vehicles, containers, vessels, or remote fixed sites, and relay the packets through a tracking Earth station and then to a control center. The ground segment is composed of gateway control centers (GCCs), gateway Earth stations (GESs) and a network control station (NCS). The GCCs provide interfacing for the subscriber communicators, leased phone lines, dial-up modems, public or private networks, and e-mail networks, including the internet. The GESs provide a communication link between the GCCs and the constellation of LEO communication satellites, including transmitting and receiving transmissions from the LEO communication satellites and transmitting and receiving transmissions from the GCCs and the NCC. The NCC manages the ORBCOMM network elements. The subscriber communicators include, for example, VHF electronics and an antenna design for integration into small packages which may typically include an alphanumeric keypad and display. More information is available concerning the ORBCOMM system at the ORBCOMM website: http://www.orbcomm.com.

SUMMARY OF THE INVENTION

The present invention is an internet based two-way data communication system for interrogating and programming the electronics of motor vehicles, with global positioning system (GPS) and real-time class 2 communication capabilities.

The vehicle data communication system according to the present invention includes a vehicle communications package (VCP) located aboard each subject motor vehicle which is electronically interfaced with selected electronics of the respective motor vehicle and which provides wireless reception of GPS signals and reception and transmission of Class 2 data with respect to communication satellites, and further includes a website having a predetermined internet URL. Wireless communication between the website and the VCP is provided via a communication satellite provider having an internet interface.

The VCP preferably includes: a subscriber communicator for providing satellite communication, as for example a Panasonic KX7101 communication module, including a GPS data reception antenna and a communication satellites receive/transmit antenna; an interface board for providing I/O interfacing with the vehicle electronics via a Class 2 interface; and a vehicle serial interface (VSI).

The website has a predetermined URL and is linked to the web on a server of an ISP hosting service or on a private server connected to the internet. The website is accessible by a user using any computer, located anywhere and having internet access, simply by entering the website URL and the user's pre-established password/user name permissions. The website provides a user selectable display for organizing data to be sent to the one or more motor vehicles and received back therefrom. For example, the website may include: mapping detail including vehicle location, current vehicle status, icons specific to predetermined vehicle related matters, vehicle history, quick search and position query, command center functionality, control console functionality, and sending and receiving Class 2 messages. The user accomplishes the Class 2 communication and function selection using a pointer (as for example a mouse) a keypad and a computer screen (display).

In operation, a VCP is respectively installed in each motor vehicle of a selected number of motor vehicles via a Class 2 interface to, for example, the vehicle Class 2 (J1850 protocol) bus and the vehicle interface connection. A user accesses the website using a computer connected to the internet, and then reads data displayed on the computer screen. The user then enters an access code to gain access to one or more of the VCPs, enters any desired commands, and then sends the commands. The commands are sent over the internet to the station URL address of a receiving station of a communication satellite provider, and the communication satellite provider then transmits the commands to the communication satellites. The communication satellites, in turn, re-transmit the commands to the Earth, which commands are thereby received by the VCPs. The VCPs whose access code has been sent will then process the commands, which can, for example, include control module interrogation, system status inquiry, or control module programming. Based upon predetermined instructions resident in the VCPs or instructions of the transmitted commands, the subject VCPs transmit to the communication satellites response data, which may include GPS information. The response data is then retransmitted from the communication satellites to the communication satellite provider which then transfers the response data to the website over the internet, using the website URL address. The user then examines the received response data and selectively continues vehicle interrogation/programming.

In an alternative embodiment of the present invention, a cellular telephone provider having an internet connection may provide wireless data transfer with the vehicle communication packages, wherein the vehicle communication package now includes a wireless phone and modem.

Accordingly, it is an object of the present invention to provide internet based two-way motor vehicle data communication.

It is a further object of the present invention to provide two-way motor vehicle data communication using a communication satellite provider.

It is another object of the present invention to provide internet based two-way motor vehicle data communication using a communication satellite provider.

These, and additional objects, advantages, features and benefits of the present invention will become apparent from the following specification.

DETAILED DESCRIPTION OF THE PREFERRED EMBODIMENT

Figure 1:
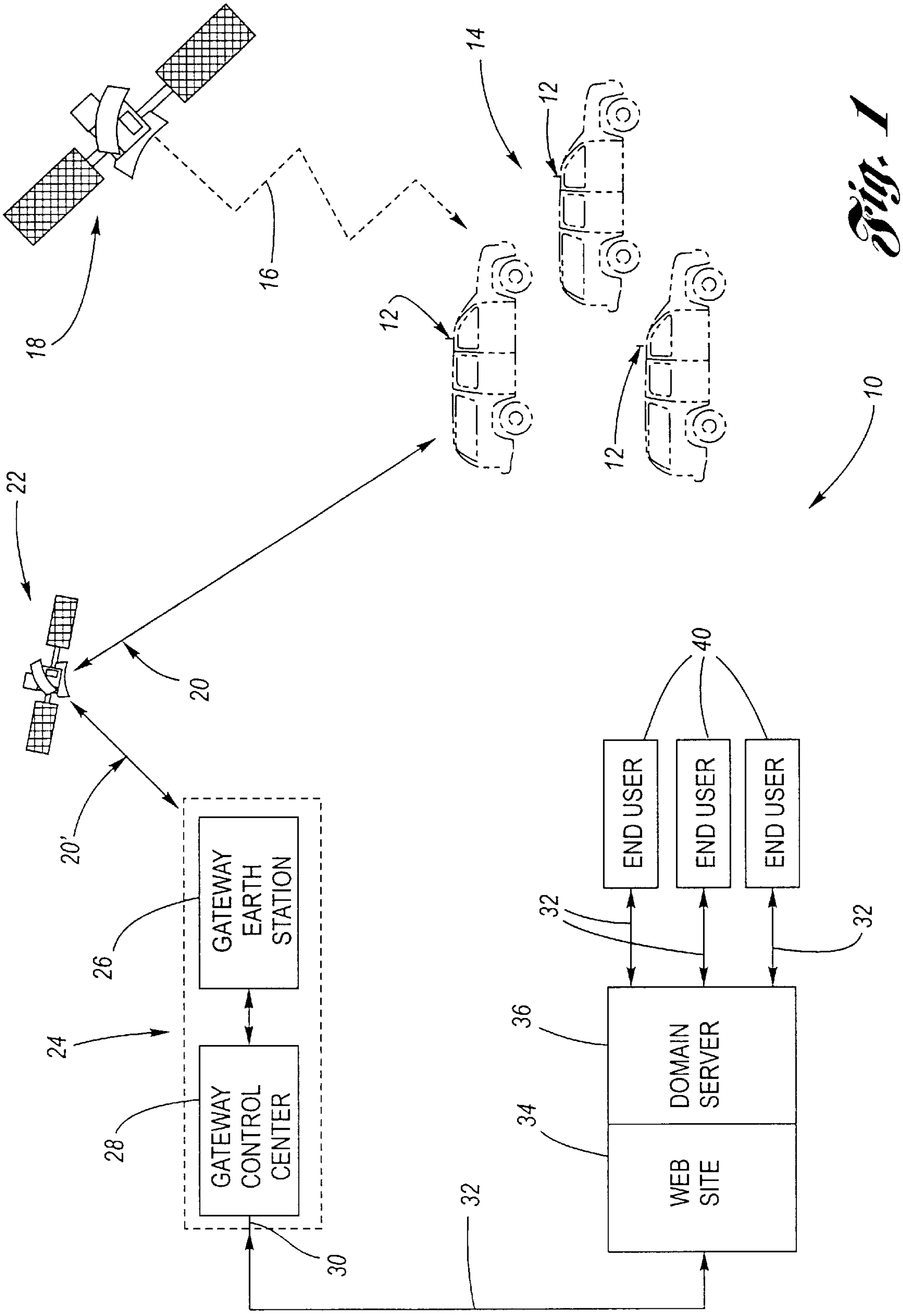
FIG. 1 is a schematic representation of the vehicle data communication system according to the present invention.

Referring now to the Drawing, FIG. 1 depicts a schematic representation of the operational elements of the vehicle data communication system 10 according to the present invention. The vehicle data communication system 10 includes a vehicle communications package (VCP) 12 (see FIG. 2) located aboard each motor vehicle 14 so as to be electronically interfaced with selected electronics of its respective motor vehicle. The VCP 12 provides wireless reception of global positioning system (GPS) signals 16 from GPS satellites 18 and reception and transmission of Class 2 data 20 with respect to communication satellites 22 operated by a communication satellites provider 24, as for example ORBCOMM. The communication satellite provider 24, operates a gateway Earth station 26 which wirelessly transmits and receives Class 2 data 20' to and from the communication satellites 22. The communication satellites provider 24 further operates a gateway control center 28 which is connected to a gateway Earth station 26 and includes a dedicated internet connection 30 having a predetermined station URL address. The internet 32 provides a data transfer route accessible to a website 34 having a predetermined website URL address (for example using a "domain name" such as in http://www.GM.com) on an ISP server 36 having dedicated internet access 38. One of more remote computers 40 having access to the internet 32 are able to establish connection to the website 34 via the website URL address and successfully passing its permissions protocols. The user of the remote computer 40 is now able to use the website 34 to both read and send the Class 2 data 20, 20' to and from the motor vehicle(s) 14.

In operation, a user uses his or her computer 40 via an internet program known commonly as a "browser" to access the website 34 via its URL. The user then gains access to the website by entering appropriate password/user name permissions. The website is visually configured for navigation by the user, as well as for data display, data entry, and data sending. For example, the website preferably includes: mapping detail including vehicle location, current vehicle status, icons specific to predetermined vehicle related matters, vehicle history, quick search and position query, command center functionality, control console functionality, and sending and receiving Class 2 messages. The user accomplishes the Class 2 communication and function selection using a pointer (as for example a mouse) a keypad and a computer screen (display) of his or her computer 40.

The user then enters an access code to gain access to one or more of the VCPs 12 of selected motor vehicles 14, enters any desired commands, and then sends the commands. The commands are sent over the internet 32 addressed to the station URL of the receiving station 28 of the communication satellite provider 24, and the gateway Earth station 26 of the communication satellite provider then transmits the commands as data packets to the communication satellites 22. The communication satellites, in turn, re-transmit the data packets toward the Earth, which data packets are thereby received by the VCPs. The selected VCPs whose access code(s) are located at the beginning of the transmitted data packet will then process the commands, which can, for example, include control module interrogation, system status inquiry, or control module programming. Based upon predetermined instructions resident in the VCPs or instructions of the transmitted commands, the subject VCPs transmit to the communication satellites response data, which may include GPS information 16. The response data is then retransmitted from the communication satellites to the communication satellite provider 24 which then transfers the response to the website 34, addressed to its website URL, over the internet 32. The user then examines the received response data displayed on the website and selectively continues vehicle interrogation/programming.

Figure 2:
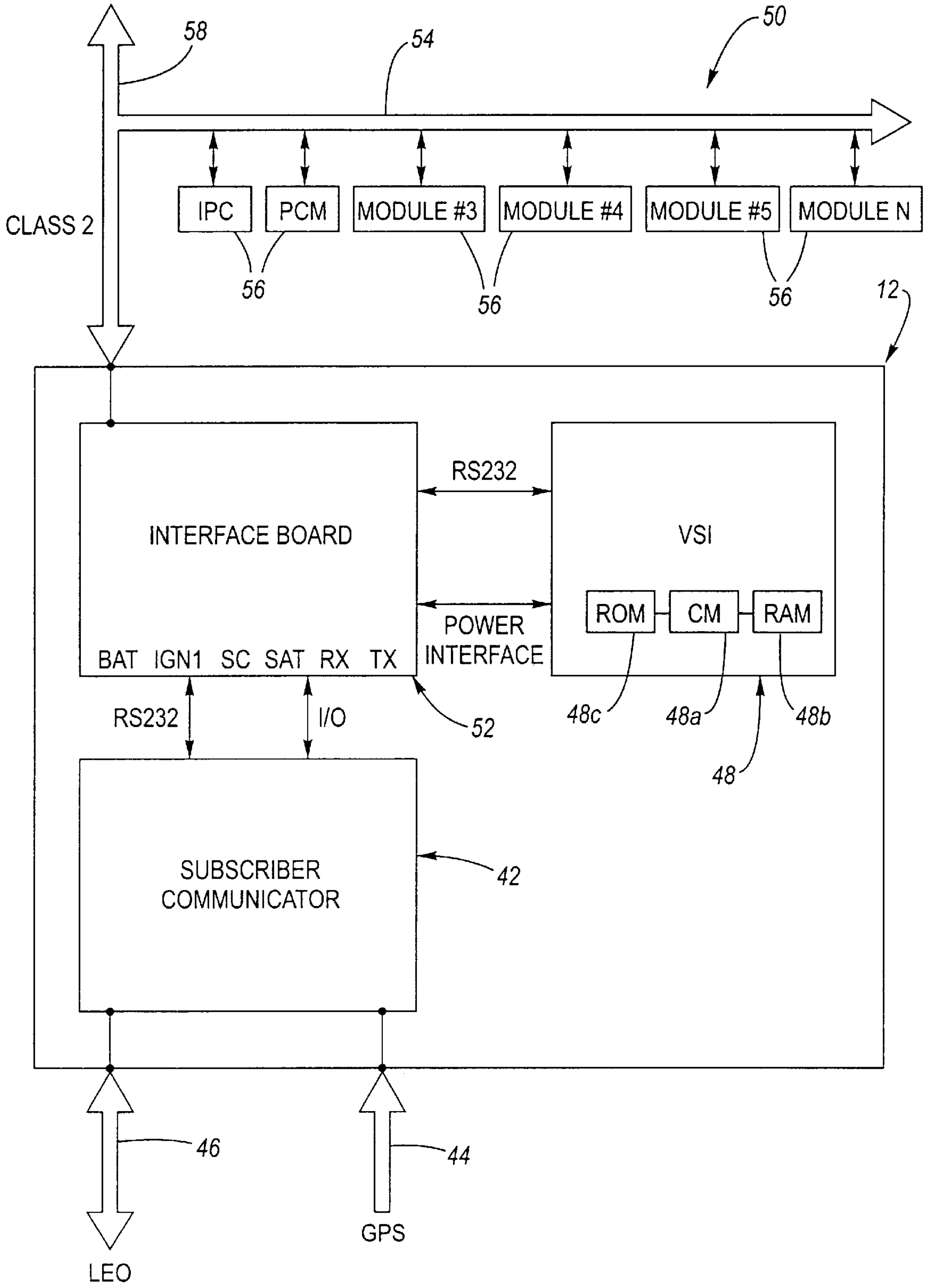
FIG. 2 is a schematic representation of a vehicle communications package according to the present invention, shown interfaced with motor vehicle electronics.

Referring now to FIG. 2, a diagrammatic representation of a preferred vehicle communications package (VCP) 12 is shown. The VCP includes a subscriber communicator 42 for providing satellite communication, as for example a Panasonic KX7101 communication module. The subscriber communicator 42 includes a GPS reception antenna 44 (hereafter simply "GPS antenna)" and an LEO communication satellites receive/transmit antenna 46 (hereinafter simply "LEO antenna"). A vehicle serial interface 48 is also included having a computer module 48*a*, RAM 48*b* and ROM 48*c* for providing programmed responses to commands received from the website 34, as well as programming for interrogating the vehicle electronics 50 and for providing selected modes of response to the website. An interface board 52 provides I/O distribution and voltage conditioning, with I/O and RS232 interfaces with the subscriber communicator 42, RS232 and power interfaces with the VSI 48, and a Class 2 interface with the vehicle electronics 50. In this regard, the Class 2 interface includes a conventional vehicle Class 2 (J1850 protocol) bus 54 interface with the vehicle electronic modules 56, which may include the instrument panel cluster module (IPC), the powertrain control module (PCM), and other electronic modules, as well as includes a conventional vehicle interface 58 connection for Class 2, ignition, battery, vehicle ground and Class 2 ground connections.

Figure 3A:
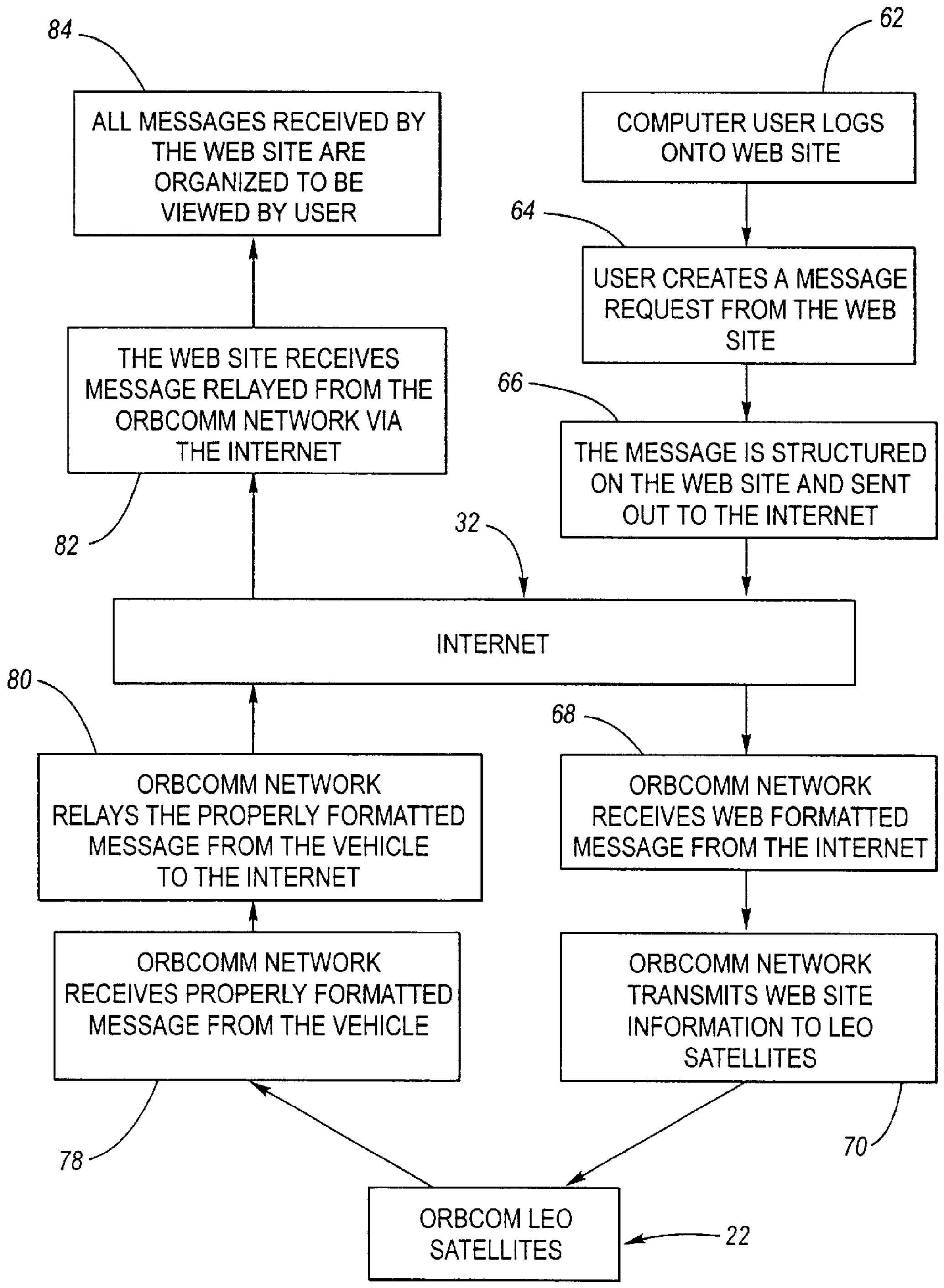
FIGS. 3A and 3B are a flow chart of execution steps of the vehicle data communication system according to the present invention.
Figure 3B:
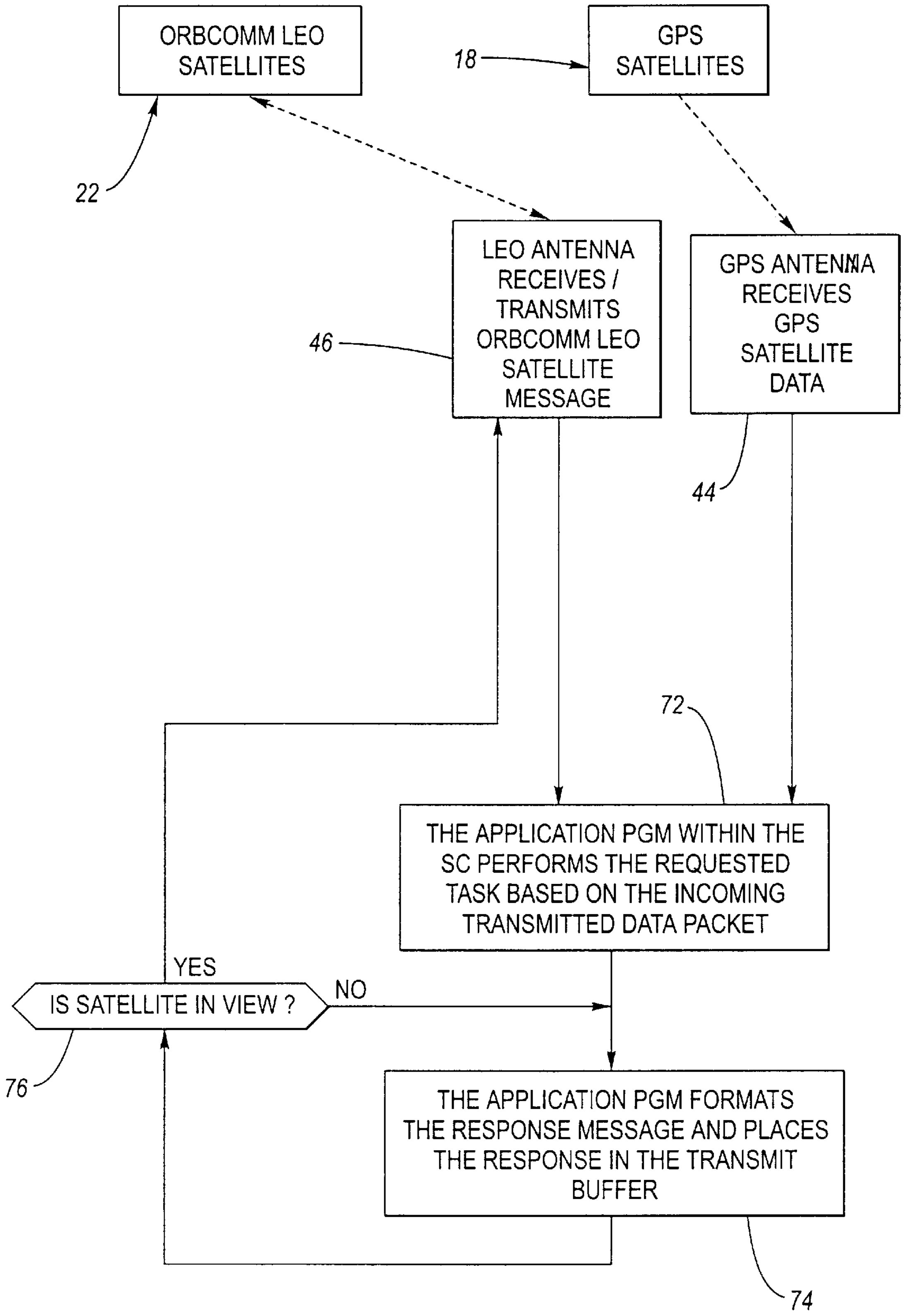

FIGS. 3A and 3B depict an execution step flow chart of the operation of the vehicle data communication system 10, which will be described with reference being additionally directed to FIGS. 1 and 2.

At execution block 60, a user uses his or her computer 40 to access the internet and log onto the website 34 by entering the website URL address and the appropriate password/username permissions. The website then displays on the user's computer screen a preselected organization of data and information, as for example generated by the assistance of an HTML text editor program. At execution block 62, the user creates a command (or request) of at least one vehicle communications package (VCP) 12 by entering a code indicative of the selected VCPs and instructions using the user's keyboard and/or pointer device. At execution block 64, the website programming structures the commands for sending onto the internet 32 as an e-mail message for delivery addressed to the station URL of the communications satellite provider.

At execution block 68, the e-mail message is received by the gateway control center 28 of the communication satellite provider 24, as for example ORBCOMM, via its dedicated internet interface 30. The e-mail message is converted to data packets and is RF transmitted via its gateway Earth station 26, at execution block 70, to the communication satellites 22 of the communication satellites provider.

The LEO Antenna 46 of the vehicle communications package 12 receives the transmitted data packets from the communication satellites. Further, the GPS antenna 44 of the vehicle communications package (VCP) receives GPS data from the GPS satellites 18. At execution block 72, the subscriber communicator 42 formats the data packets into data intelligible by the VSI 48; and the application program of the VSI performs the requested commands of the transmitted data from the website. Upon completion of execution of the commands, the application program formats a response message into data packets and stores it in a transmit buffer at execution block 74. At decision block 76, inquiry is made whether a communication satellite is in view. If not, the application program waits; if it is, the response message is RF transmitted to the communication satellite 22 via the LEO antenna 46.

The response data packets are retransmitted by the communication satellite 22 and is received at execution block 78 by the communication satellite provider at its gateway Earth center 26. At execution block 80, the response data packets are formatted into an e-mail message and then sent onto the internet to the website 34, using the website URL, via the gateway control center 28.

The e-mail is received by the website 34 and posted thereon in a predetermined format by the text editor program at execution blocks 82 and 84, whereupon the user may continue communication with any VCPs 12.

Figure 4:
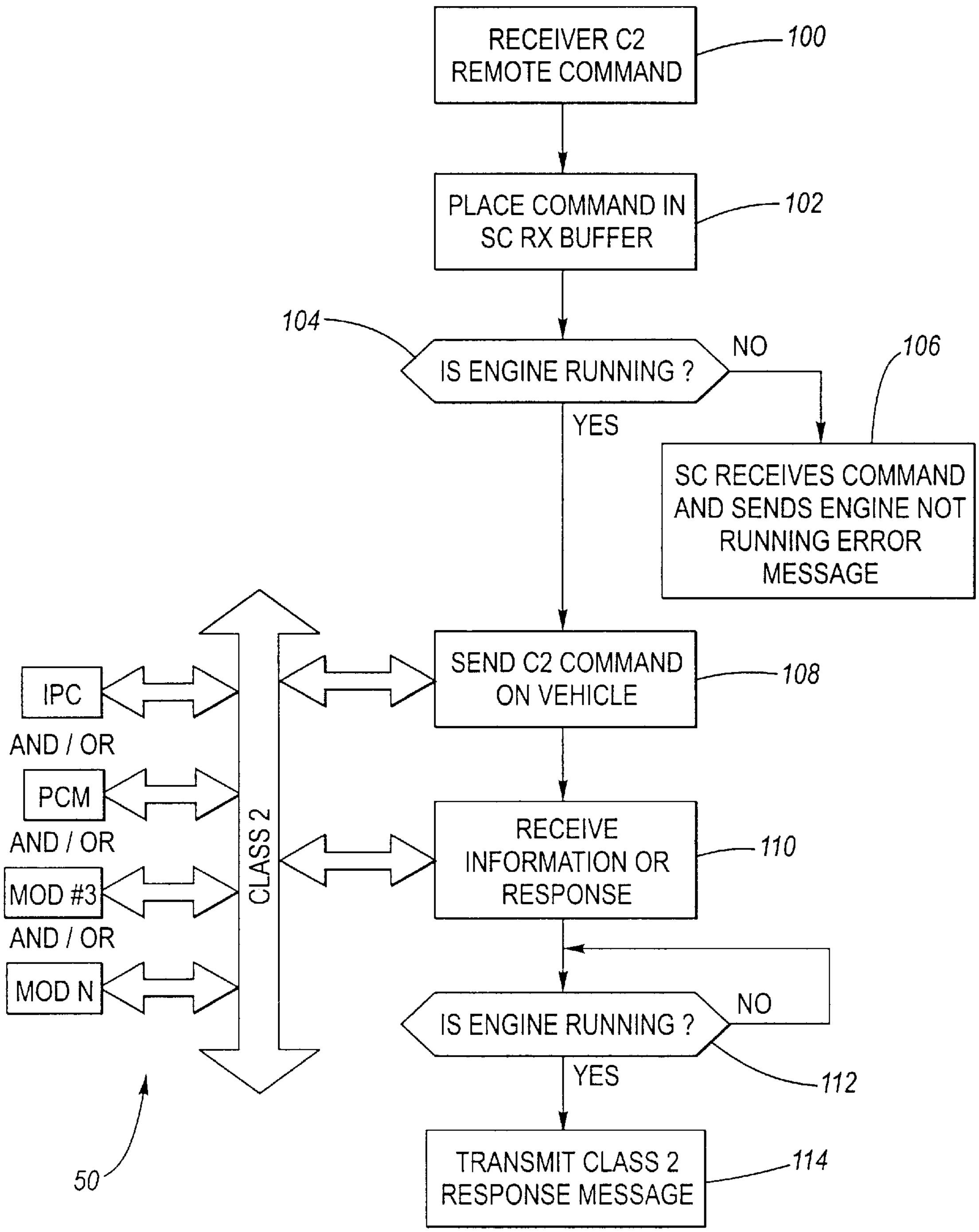
FIG. 4 is a flow chart of execution steps of an applications program of the vehicle communications package in response to a received command from the website.

FIGS. 4 though 9 depict flow charts of execution steps of the application program of the VCPs 12 under various scenarios.

FIG. 4 depicts an execution flow chart for the applications program in response to reception of a command from the website. At execution block 100 a Class 2 data command is received by the VCP 12. The command is placed into a data buffer in the subscriber communicator at execution block 102. The program next inquires at decision block 104 whether the vehicle engine is running. If not, the program sends, at execution block 106, an engine not running error message to the website. If it is running, the program then sends out a Class 2 data command to the vehicle electronics 50 of the vehicle. At execution block 110 data is received by the program from the vehicle electronics 50, and a response is formatted for transmission. At decision block 112 the program inquires whether a communication satellite is in view. If not, the program waits. If a communication satellite is in view, then the program then transmits the response to the website.

Figure 5:
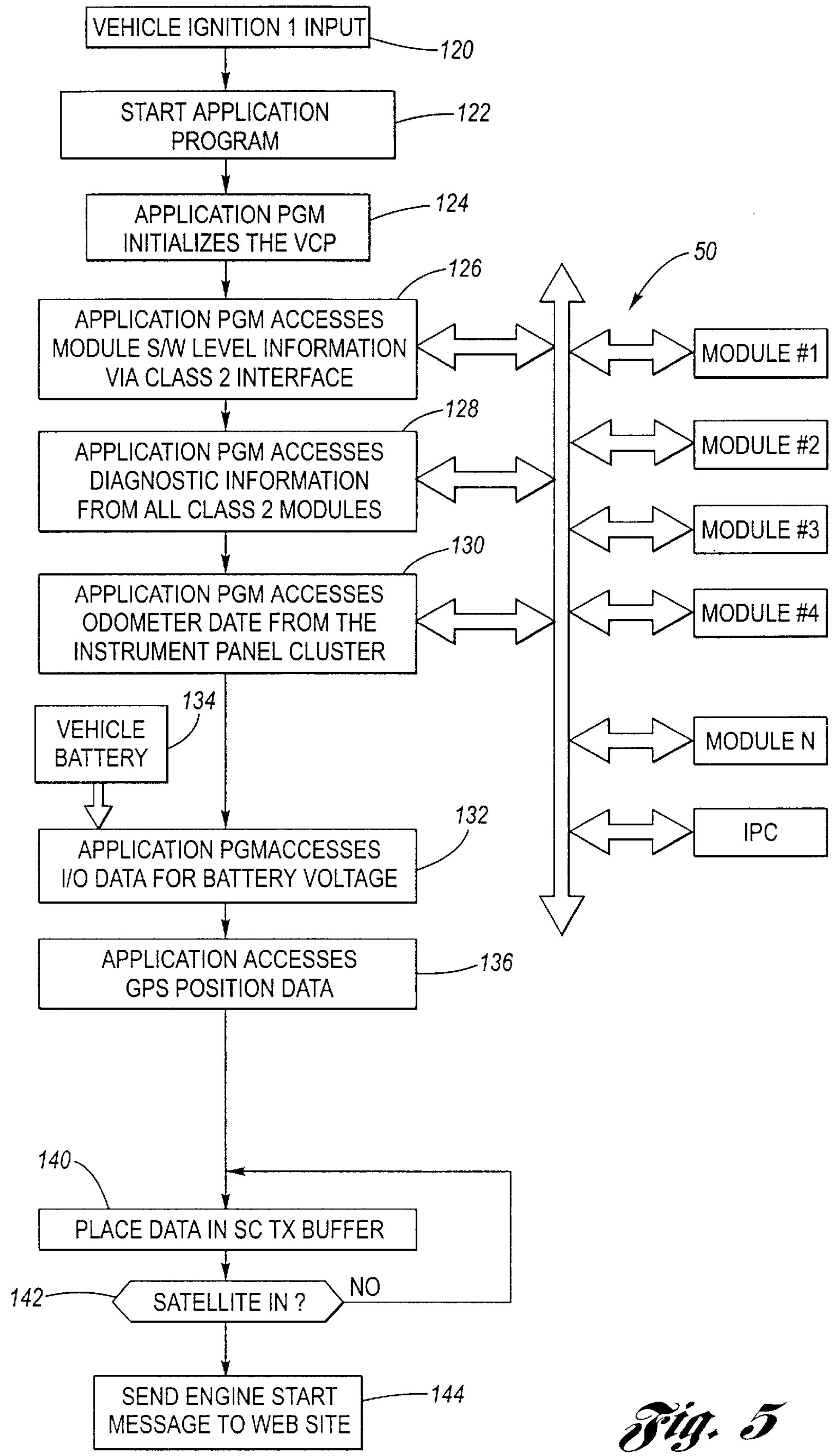
FIG. 5 is a flow chart of execution steps of the applications program of vehicle communications package in response to an engine start.

FIG. 5 depicts an execution flow chart for the applications program in response to an engine start. At execution block 120 an ignition signal is initiated at engine start. At execution block 122 the on program is started in response to detection of the ignition signal. At execution block 124 the program initializes the vehicle communications package 12. Next at execution block 126, the program interrogates the vehicle electronics 50 via Class 2 interface. Next at execution block 130, the program interrogates the vehicle electronics 50 for odometer information. Next at execution block 132, the program obtains voltage of the vehicle battery 134. Next, the program access GPS data via the GPS antenna at execution block 136. The program then, at execution block 140, places the acquired data in a buffer of the subscriber communicator 42. The program then inquires at decision block 142 whether a communication satellite is in view. If not, the program waits. If a communication satellite is in view, then the program transmits the data via the LEO antenna.

Figure 6:
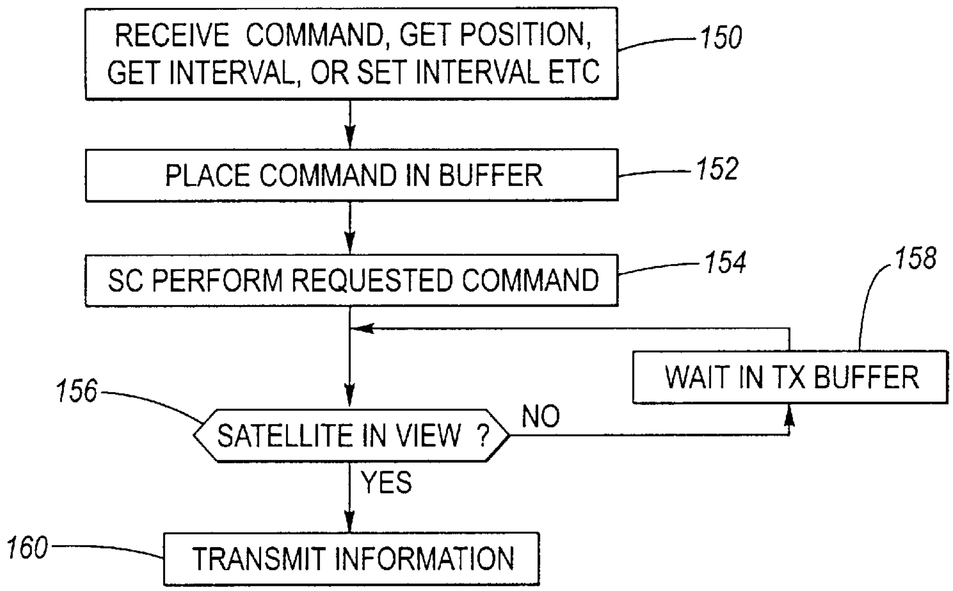
FIG. 6 is a flow chart of execution steps of the applications program of vehicle communications package in response to a received command from the website, engine running.

FIG. 6 depicts an execution flow chart for the applications program in response to a received command from the website, wherein the engine is running. At execution block 150, a command is received from the website. At execution block 152 the command is placed in the buffer of the vehicle communications package. The program then executes the command at execution block 154. The program then inquires at decision block 156 whether a communication satellite is in view. If not, the program places the data responsive to the command into a buffer at execution block 158 and waits. If a communication satellite is in view, then the program transmits the data at execution block 160.

Figure 7:
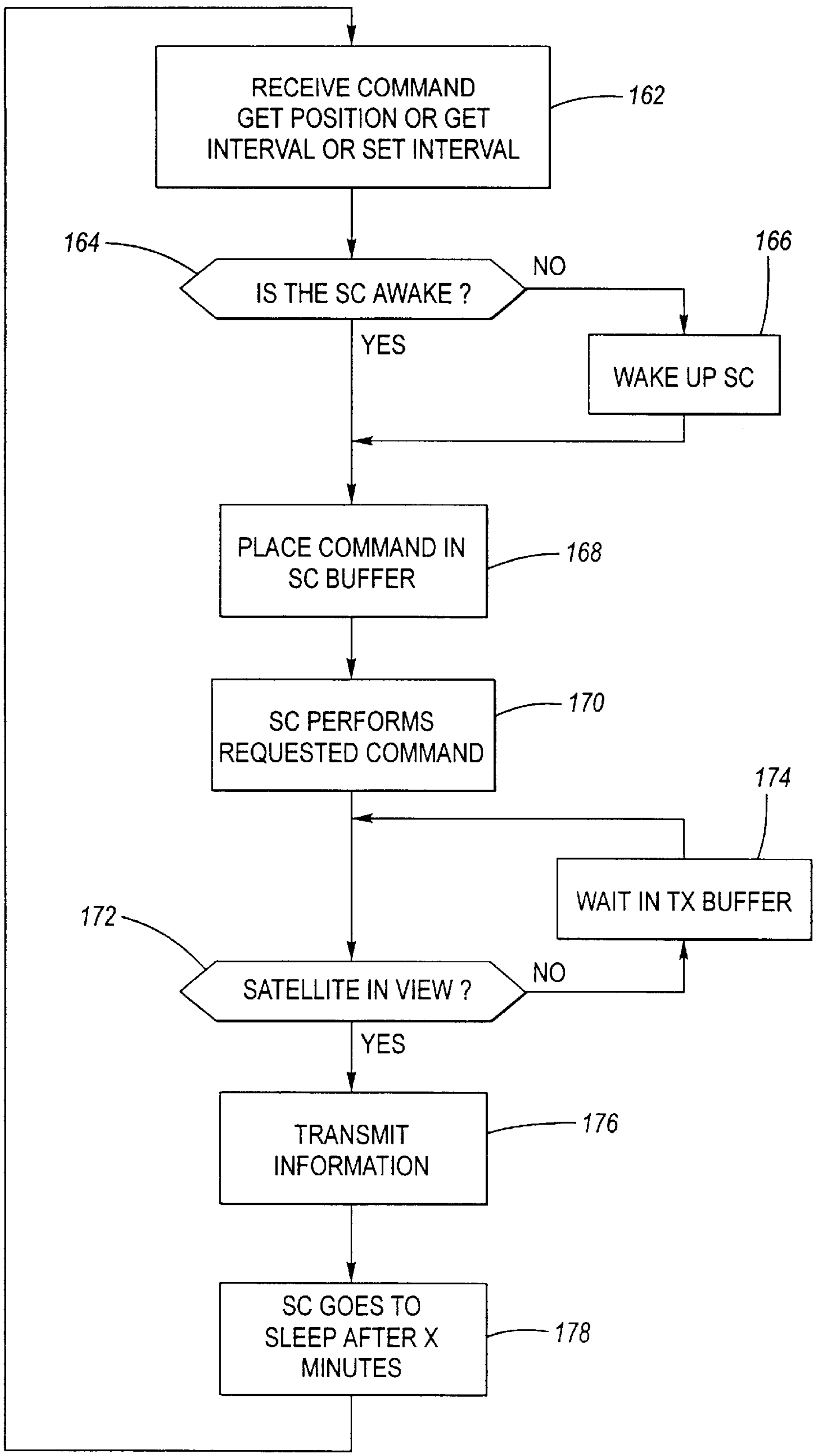
FIG. 7 is a flow chart of execution steps of the applications program of the vehicle communications package in response to a received command from the website, engine not running.

FIG. 7 depicts an execution flow chart for the applications program in response to a received command from the website, wherein the engine is not running. At execution block 162 the vehicle communications package receives a command from the website. The program then inquires at decision block 164 whether the subscriber communication is awake. If not, the program awakens the subscriber communicator at execution block 166. The program then, at execution block 168, places the command in a buffer. Next, the program executes the command at execution block 170. With data collected in response to the command, the program then inquires at decision block 172 whether a communication satellite is in view. If not, the data is placed in a buffer at execution block 174 and the program waits. If a communications satellite is in view, then the program transmits the data at execution block 176. Thereafter, in a preselected elapse of time, the program places the subscriber communicator into sleep mode at execution block 178.

Figure 8:
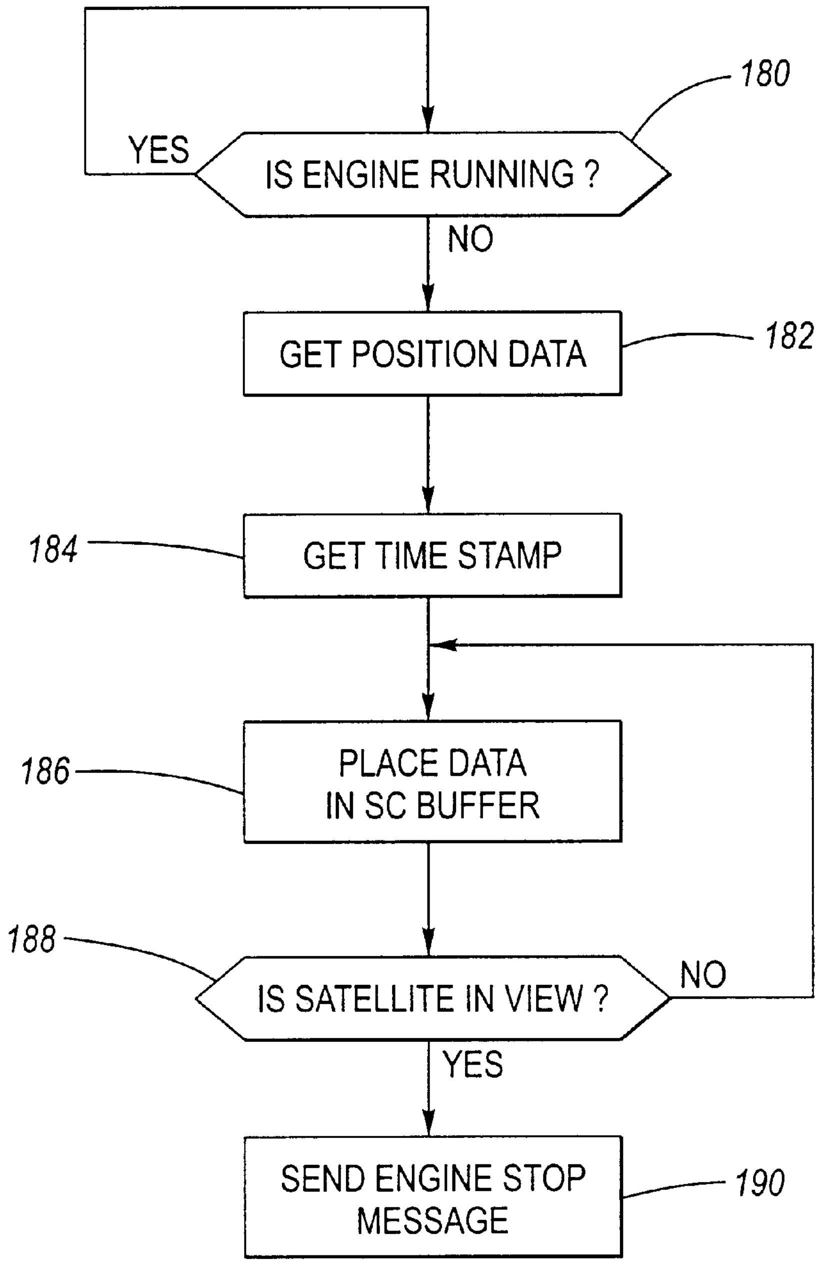
FIG. 8 is a flow chart of execution steps of the applications program of the vehicle communications package in response to an engine stop.

FIG. 8 depicts an execution flow chart for the applications program in response to an engine stop. The program inquires at decision block 180 whether the engine is running. If it is the program waits. If not, the program acquires GPS position data at execution block 182, inquires of the time of engine stop at execution block 184, and places the acquired data in a buffer at execution block 186. The program then inquires whether a communication satellite is in view. If not, the program waits. If a communication satellite is in view, then the program transmits the data at execution block 190.

Figure 9:
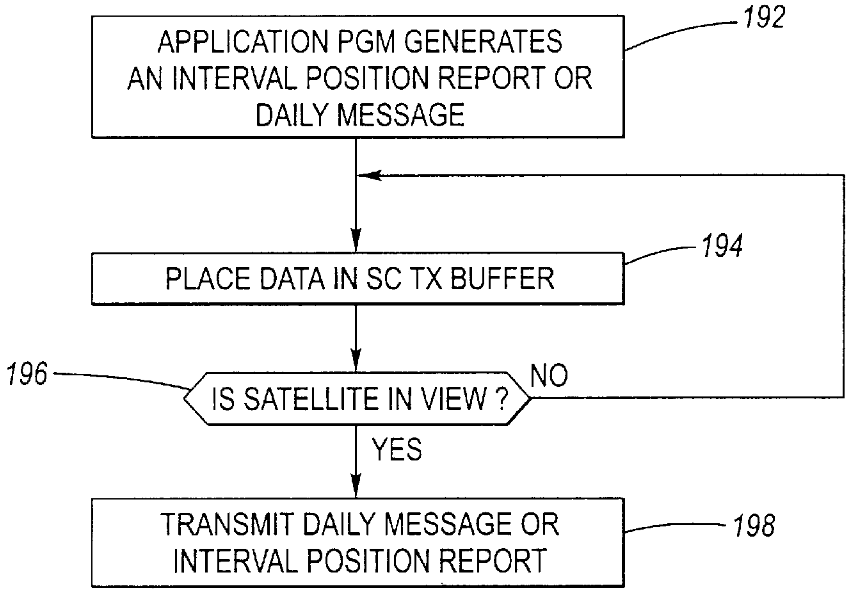
FIG. 9 is a flow chart of execution steps of the applications program of the vehicle communications package in response to program instructions to periodically transmit a report.

FIG. 9 depicts an execution flow chart for the applications program to transmit periodic reports. At execution block 192, the program generates a report. Next, the program places the report into a buffer at execution block 194. The program then inquires at decision block 196 whether a communications satellite is in view. If not, the program waits. If a communication satellite is in view, then the program transmits the report at execution block 198.

Figure 10:
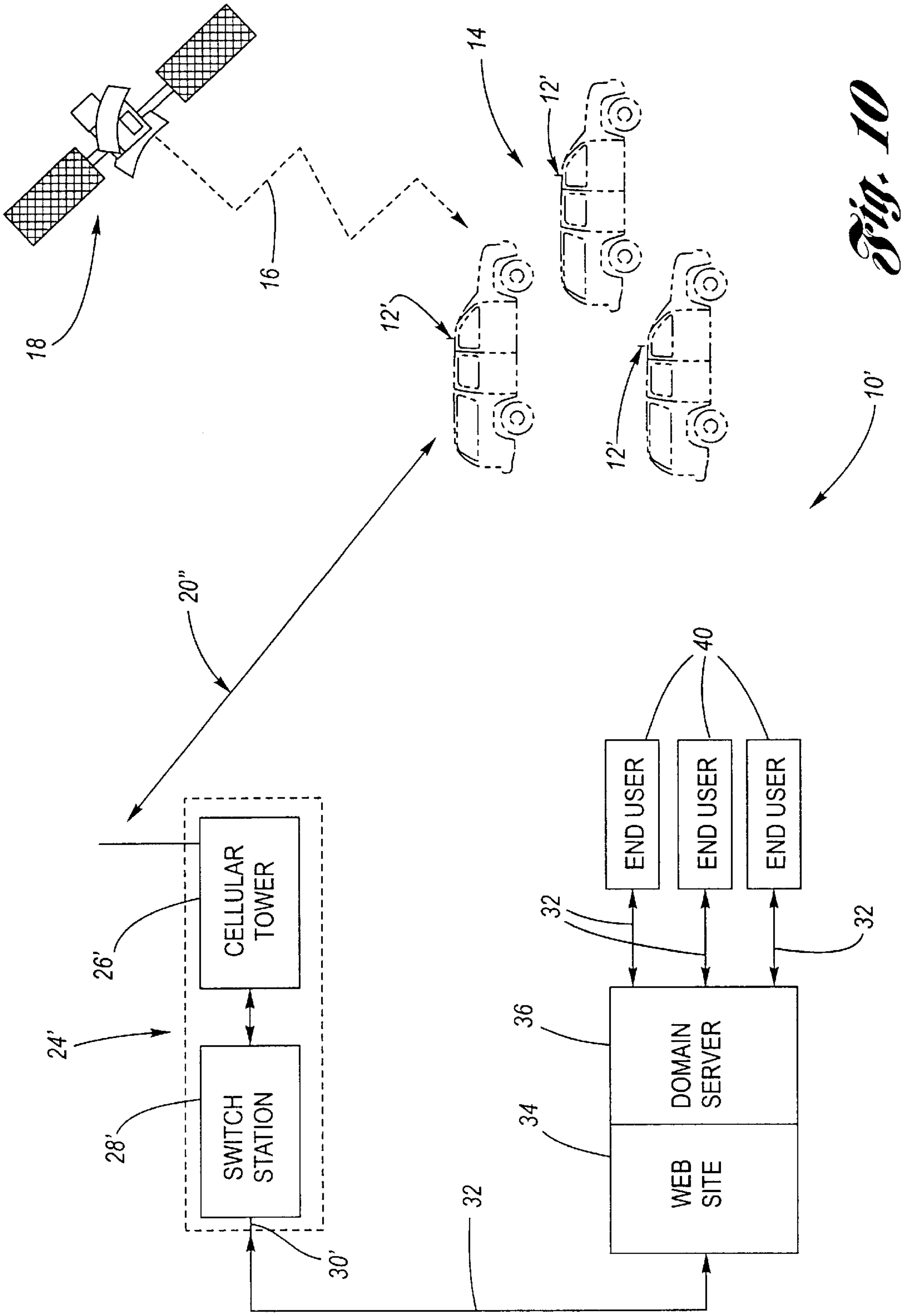
FIG. 10 is a schematic representation of an alternative vehicle data communication system according to the present invention.
Figure 11:
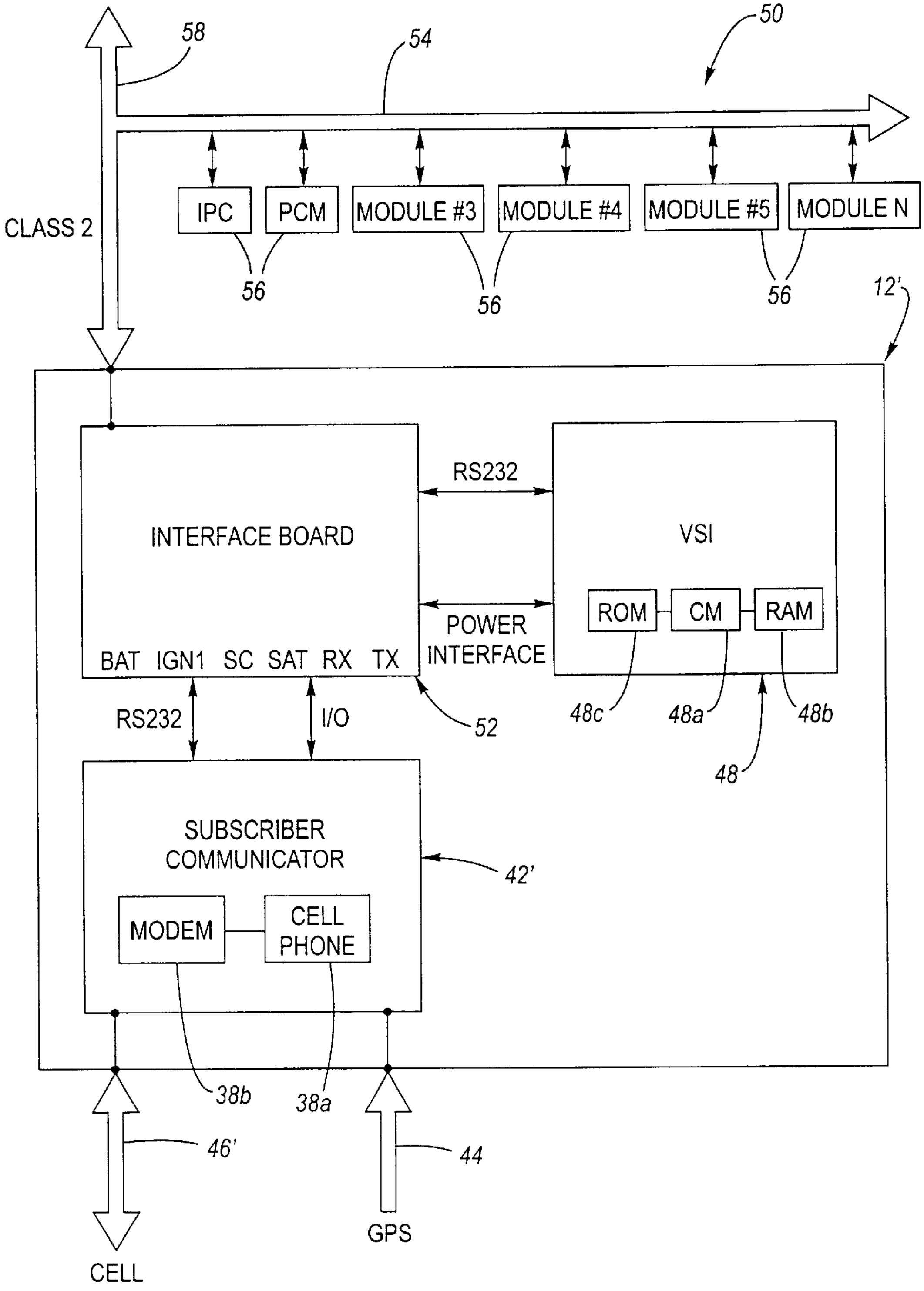
FIG. 11 is a schematic representation of an alternative vehicle communications package according to the present invention, shown interfaced with motor vehicle electronics.

While it is preferred to use a satellite communications provider as described hereinabove, it is also possible to use a cellular telephone provider having an internet connection. Referring now to FIGS. 10 and 11, FIG. 10 depicts a schematic representation of the operational elements of an alternative vehicle data communication system 10' according to the present invention. The vehicle data communication system 10' includes a vehicle communications package (VCP) 12' (see FIG. 11) located aboard each motor vehicle 14 so as to be electronically interfaced with selected electronics of its respective motor vehicle. The VCP 12' provides wireless reception of global positioning system (GPS) signals 16 from GPS satellites 18 and reception and transmission of Class 2 data 20' with respect to a multiplicity of spaced cellular towers 26' of a cellular telephone provide 24'. The cellular telephone provider 24', operates switch stations 28' which wirelessly transmits and receives Class 2 data 20' to and from the cellular towers with respect to cellular telephones and land telephone lines. The switch stations 28' of the cellular telephone provider 24' further have a dedicated internet connection 30' having a predetermined switch station URL address. The internet 32 provides a data transfer route accessible to a website 34 having a predetermined website URL address (for example http://www.GM.com) on an ISP server 36 having dedicated internet access 38. One of more remote computers 40 having access to the internet 32 are able to establish connection to the website 34 via the website URL address and successfully passing its permissions protocols. The user of the remote computer 40 is now able to use the website 34 to both read and send the Class 2 data 20" to and from the motor vehicle(s) 14.

In operation, a user uses his or her computer 40 via an internet program known commonly as a "browser" to access the website 34 via its URL. The user then gains access to the website by entering appropriate password/user name permissions. The website is visually configured for navigation by the user, as well as for data display, data entry, and data sending.

For example, the website preferably includes: mapping detail including vehicle location, current vehicle status, icons specific to predetermined vehicle related matters, vehicle history, quick search and position query, command center functionality, control console functionality, and sending and receiving Class 2 messages. The user accomplishes the Class 2 communication and function selection using a pointer (as for example a mouse) a keypad and a computer screen (display) of his or her computer 40.

The user then enters an access code to gain access to one or more of the VCPs 12' of selected motor vehicles 14, enters any desired commands, and then sends the commands. The commands are sent over the internet 32 addressed to the switch station URL of the switch station 28' of the cellular telephone provider 24', and an in view cellular tower 26' of the cellular telephone provider then transmits the commands as data packets to the VCPs 12'. The selected VCPs whose access code(s) are located at the beginning of the transmitted data packet will then process the commands, which can, for example, include control module interrogation, system status inquiry, or control module programming. Based upon predetermined instructions resident in the VCPs or instructions of the transmitted commands, the subject VCPs transmit to an in view cellular tower 26' response data, which may include GPS information 16. The response data is routed to a switch station 28', which then transfers the response to the website 34, addressed to its website URL, over the internet 32. The user then examines the received response data displayed on the website and selectively continues vehicle interrogation/programming.

Referring now to FIG. 11, a diagrammatic representation of a preferred vehicle communications package (VCP) 12' is shown. The VCP includes a subscriber communicator 42' for providing cellular telephone communication. The subscriber communicator 42' includes a GPS reception antenna 44 (GPS antenna) and a cellular telephone receive/transmit antenna 46' (cell antenna), wherein a cellular telephone **38*a* and modem 38*b* therefore are connected with the cell antenna 46'. A vehicle serial interface 48 is also included having a computer module 48_a_, RAM 48_b_ and ROM 48_c_ for providing programmed responses to commands received from the website 34, as well as programming for interrogating the vehicle electronics 50 and for providing selected modes of response to the website. An interface board 52 provides I/O distribution and voltage conditioning, with I/O and RS232 interfaces with the subscriber communicator 42, RS232 and power interfaces with the VSI 48, and a Class 2 interface with the vehicle electronics 50. In this regard, the Class 2 interface includes a conventional vehicle Class 2 (J1850 protocol) bus 54 interface with the vehicle electronic modules 56, which may include the instrument panel cluster module (IPC), the powertrain control module (PCM), and other electronic modules, as well as includes a conventional vehicle interface 58** connection for Class 2, ignition, battery, vehicle ground and Class 2 ground connections.

To those ordinarily skilled in the art, the hereinabove description of program steps elucidated in FIGS. 3A through 9, provide sufficient disclosure to adapt those program steps to a cellular telephone mode of operation, so that, for the sake of brevity, such exposition is obviated.

To those skilled in the art to which this invention appertains, the above described preferred embodiment may be subject to change or modification. Such change or modification, such as for example a modification of the shape of the resilient lock arms, can be carried out without departing from the scope of the invention, which is intended to be limited only by the scope of the appended claims.

What is claimed is:

1. An internet based vehicle data communication system comprising:

a vehicle communications package in communication with an automotive communication network for interfacing with electronics of a motor vehicle, said vehicle communications package having a wireless communications device for sending and receiving data;

a wireless data communication system, said wireless data communication system communicating with said vehicle communications package, said wireless data communication system having an internet connection;

a website hosted on a server having an internet connection; and at least one computer having an internet connection;

wherein the at least one computer is enabled to receive and send data to the vehicle communications package via the aforesaid internet connections, said website and said wireless data communication system; and wherein said wireless communication system comprises a constellation of communication satellites in communication with at least one station of a communication satellite provider, wherein the at least one station provides said internet connection with respect to the constellation of satellites, wherein the wireless communication system comprises a cellular telephone provider; wherein vehicle communications package includes a cellular telephone modem; and wherein cellular telephone provider provides an internet connection.

2. The vehicle communications system of claim 1, wherein said data comprises Class 2 data.

3. The vehicle communication system of claim 2, further comprising said vehicle communications package being capable of receiving global positioning system data.

4. A method of data communication between a motor vehicle and at least one computer, comprising the steps of:

transmitting data between a website and a vehicle communications package of a motor vehicle; and using a computer to access the website to read vehicle data sent from the motor vehicle and to enter command data to the website and thereupon send the command data to the motor vehicle;

wherein said step of transmitting data comprises transmitting Class 2 data accessed from an automotive communication network; and wherein said step of wireless data transmission comprises transmitting data between an internet connection and at least one communication satellite, and between the at least one communication satellite and the vehicle communications package; and wherein said step of wireless data transmission further comprises transmitting data between said internet connection and at least one cellular telephone provider, and between the cellular telephone provider and the vehicle communications package.

5. The method of claim 4, wherein said step of transmitting data further comprises the steps of:

wireless data transmission; and internet data transfer.

6. The method of claim 5, wherein said step of internet data transfer comprises transferring data between the website and a wireless communication provider, and further between the computer and the website.

7. The method of claim 6, wherein said step of transmitting data further comprises transmitting Class 2 data.

* * * * *